(12) United States Patent
Hayden et al.

(10) Patent No.: US 6,346,352 B1
(45) Date of Patent: Feb. 12, 2002

(54) QUARTZ DEFECT REMOVAL UTILIZING GALLIUM STAINING AND FEMTOSECOND ABLATION

(75) Inventors: Dennis M. Hayden; Timothy E. Neary, both of Essex Junction; John N. Ross, St. Albans, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/512,951

(22) Filed: Feb. 25, 2000

(51) Int. Cl.$^7$ .............. G03F 9/00; G21K 5/10
(52) U.S. Cl. .................. 430/5; 250/492.21
(58) Field of Search ............ 430/5, 322; 382/144, 382/149; 250/492.2, 492.21

(56) References Cited

U.S. PATENT DOCUMENTS

| | | | |
|---|---|---|---|
| 5,035,787 A | 7/1991 | Parker et al. | 204/192.34 |
| 5,382,484 A | 1/1995 | Hosono | 430/5 |
| 5,405,721 A | 4/1995 | Pierrat | 430/5 |
| 5,439,763 A | 8/1995 | Shimase et al. | 430/5 |
| 5,882,823 A | 3/1999 | Neary | 430/5 |
| 6,028,953 A | * 2/2000 | Nakamura et al. | 430/5 |
| 6,096,459 A | * 8/2000 | Yang | 430/5 |
| 6,165,649 A | * 12/2000 | Grenon et al. | 430/5 |

OTHER PUBLICATIONS

Cabria, T. D. et al. Mask and Circuit Repair with Focused–Ion Beams. Solid State Technology, (Sep. 1987) pp. 133–136.

* cited by examiner

*Primary Examiner*—S. Rosasco
(74) *Attorney, Agent, or Firm*—DeLio & Peterson LLC; Peter W. Peterson; Richard M. Kotulak

(57) ABSTRACT

The present invention discloses a method of controlling the precise removal of unwanted material from a light transmittable substrate for isolating and removing defects from a surface of the light transmittable substrate and for direct writing of a reticle or photomask, and the resultant reticle or photomask. The depth of ion implantation of a light absorbing material such as gallium, arsenic, boron, phosphorus, antimony or combinations thereof into the defect and/or the areas surrounding the defect on the light transmittable substrate controls the depth of material removed from the substrate. Unexpectedly, the use of laser ablation at pulses not greater than $10^{-5}$ seconds to remove the unwanted material provides precision removal while preventing heat damage to the substrate.

32 Claims, 3 Drawing Sheets

QUARTZ DEFECT REMOVAL UTILIZING GALLIUM STAINING AND FEMTOSECOND ABLATION

BACKGROUND OF THE INVENTION

1. Field of the Invention

The present invention relates to a method of repairing and writing a reticle or photomask or any light transmittable substrate. More particularly, it relates to a method of using short duration laser ablation to repair bump and divot defects on a light transmittable substrate.

2. Description of Related Art

The use of lithographic technology in transferring patterns from photomasks to semiconductor substrates in the fabrication of semiconductor devices, such as integrated circuits, has been highly developed and widely used. Reticles, or photomasks, are used with a variety of radiation sources, both visible and ultraviolet, as well as x-rays and electron beams.

Typically, the substrates of a reticle or photomask comprise a transparent material which allows light to pass through preferably at greater than 98% transmittance. Suitable substrate materials include soda lime glass, quartz (lightly doped and undoped), and sapphire. A metal or other light blocking or opaque material is then blanket deposited on the transparent substrate to be patterned and etched to a desired integrated circuit pattern. One type of photomask, a phase shift mask, which may or may not include an opaque material deposited thereon, utilizes etched portions of the quartz substrate itself to form the pattern. Wherein the phase shift mask has a patterned metal layer thereover, etching the quartz also provides a means for attenuating the pattern at the edges to provide higher resolution during photolithography.

In order to prepare the quartz substrate for fabrication of the photomask, the substrate is first planarized to provide a smooth surface within acceptable process parameters. However, planarization according to known means in the art such as plasma etching or chemical mechanical polishing will still leave defects. Generally, bump defects occur when the planarization process does not provide sufficient planarization in a localized area on the substrate surface. Bump defects, if left uncorrected on the substrate surface, alter the phase shift of the substrate. It may also adversely affect the quality of the pattern when the metal layer is deposited thereover since the metal deposited over the bump defect may be semi-transparent. Substrates with bump defects must be scrapped leading to waste and high manufacturing costs. Thus, it would be desirable to provide a means of localized repair for the quartz substrate, and in general, for any transparent substrate.

After planarization of the substrate, the metal or light blocking material is blanket deposited, patterned and etched to the desired integrated circuit pattern. Typically, a photoresist is used to pattern the light blocking material. Etching by means of chemical etching may result in divot defects when over-etching occurs and a portion of the substrate is also removed. Divot defects would alter the phase shift of the photomask reducing the clarity of the projected integrated circuit pattern onto a semiconductor wafer. Given the tight constraints on line width in the current generation and the next generation of semiconductor devices, divot and other defects on the photomasks cannot be tolerated in photolithographic techniques.

The prior art addresses the repair of opaque and clear defects resulting from either too much metal on the substrate, e.g., chrome bridges, or too little metal on the substrate, e.g., pinholes, but does not address repairing the transparent substrate. U.S. Pat. No. 5,035,787 to Parker discloses a method of repairing opaque and clear defects using a focused ion beam (FIB). Opaque defects are sputter etched with minimum mask damage while clear defects are filled in directly from the beam using a source which is compatible with the mask material. However, no mention is made of repairing the substrate, only defects caused by the patterning and etching of the metal layer is addressed.

U.S. Pat. No. 5,382,484 to Hosono describes a method of removing a bump defect in a phase shift mask by coating the bump with a correction film formed by a deposition gas and the FIB, and etching back the film and bump with a focused ion beam using a gallium source. Divots are filled with a spin-on-glass film and etched back with an FIB. Gallium stains and residue from the correction are then removed with an Nd:YAG laser having a wavelength of 532 nm. This technique, although addressing the need for repair of defects on the transparent substrate, utilizes sputter etching with the FIB which can lead to damaged areas printing onto wafers in some circumstances.

U.S. Pat. No. 5,405,721 to Pierrat repairs quartz with a gallium source FIB and removing the gallium stains with wet etching. The problem lies in being able to etch the same depth from the substrate, the top shifting layer and the bottom shifting layer of the phase shift mask to compensate for the phase shift.

U.S. Pat. No. 5,439,763 to Shimase et al. corrects defects in the phase shifter portions of photomasks by using an etch stop layer under the phase shifter comprising $Al_2O_3$ during FIB planarization using a reactive gas to planarize the defect down to the etch stop layer. This method requires that an additional layer be added to the photomask which may effect the transmittance of the photomask.

U.S. Pat. No. 5,882,823 to Neary, assigned to the assignee of the present invention, discloses a two-step FIB repair process wherein the FIB is used to core out a quartz bump defect leaving a thin wall of quartz which is removed using an isotropic hydrofluoric acid etch. FIB at an angle may also be used to remove the remaining walls and for removing attached metal defects. However, the wet etch is performed over the entire photomask and is not conducive to localized repairs.

Thus, there remains a need for localized repair of the transparent, particularly quartz, substrate in the fabrication of reticles and photomasks.

Bearing in mind the problems and deficiencies of the prior art, it is therefore an object of the present invention to provide a method of localized repair of the transparent substrate used in reticles and photomasks which would correct bump and divot defects.

It is another object of the present invention to provide a method of localized repair of quartz substrates used in reticles and photomasks.

A further object of the invention is to provide a method of repairing bump defects on transparent substrates used in reticles and photomasks.

It is yet another object of the present invention to provide a method of repairing divot defects on transparent substrates used in reticles and photomasks.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of correcting a bump defect on a phase shift mask comprising the steps of: implanting a light absorbing material into the bump defect; and irradiating the light absorbing material implanted into the bump defect until substantially all of the light absorbing material is removed.

Preferably, the step of implanting a light absorbing material comprises implanting a light absorbing material selected from the group consisting of gallium, boron, phosphorus, arsenic, antimony and combinations thereof. Most preferably, the step of implanting a light absorbing material comprises implanting gallium ions into the bump defect.

Preferably, the step of irradiating the light absorbing material comprises irradiating the light absorbing material with a laser operating at femtosecond and/or attosecond pulses.

In a second aspect, the present invention is directed to a method of correcting a defect in a substrate comprising the steps of: providing a light transmittable substrate, the substrate having one or more bump defects; implanting light absorbing ions into a bump defect on the substrate to form a stained bump; laser ablating the stained bump leaving a corrected surface of the substrate which is substantially planar.

The step of providing a light transmittable substrate may comprise providing a substrate comprising glass, soda lime glass, quartz or sapphire. The step of providing a light transmittable substrate may comprise silicon dioxide doped with about 100 parts per million fluorine. The step of providing a light transmittable substrate may comprise providing a light transmittable substrate having a layer of a patterned light blocking material thereover. Furthermore, the step of providing a light transmittable substrate may also comprise providing a reticle for photolithography.

Preferably, the step of implanting light absorbing ions comprises implanting light absorbing ions selected from the group consisting of gallium, boron, phosphorus, arsenic, antimony and combinations thereof. The list of light absorbing materials is not exhaustive and other light absorbing materials are contemplated. The step of implanting light absorbing ions comprises implanting light absorbing ions such that a concentration gradient of the light absorbing ions extends into the substrate from a top surface of the bump defect. Preferably, the step of implanting light absorbing ions comprises: implanting light absorbing ions into the bump defect such that the light absorbing ions are implanted into the bump defect at a distance equal to a maximum height of the bump defect; and implanting light absorbing ions into the bump defect such that the light absorbing ions are implanted into the bump defect at a distance less than a maximum height of the bump defect such that during the step of laser ablating the stained bump, only those areas stained by implantation are removed to control formation of a substantially planar corrected surface. Preferably, the step of implanting light absorbing ions utilizes a focused ion beam having one or more sources selected from the group consisting of gallium, boron, phosphorus, arsenic, antimony and combinations thereof. Unexpectedly, the step of implanting light absorbing ions controls the depth of substrate material removed during the step of laser ablating the stained bump. Preferably, the step of laser ablating comprises irradiating the stained bump with a laser at such an energy and for a period of time that heat does not dissipate into the substrate utilizing pulses not greater than $10^{-15}$ seconds.

In a third aspect, the present invention is directed to a method of repairing a defect on a substrate comprising the steps of: providing a transmittable substrate having thereover a patterned light blocking layer, the substrate having one or more divots thereon; implanting a light absorbing material into the substrate surrounding the one or more divots forming a stained area around the divot; and laser ablating the stained area leaving a corrected surface planar with a surface of the divot utilizing pulses not greater than $10^{-15}$ seconds.

During the step of laser ablating the stained area, if a depth of substrate material removed is greater than 60° of phase, the method further includes the step of implanting a light absorbing material into non-corrected areas of the substrate to cause a phase of the substrate to be 360°, and laser ablating the non-corrected surface of the substrate such that a transmission phase for the corrected surface is about equal to a transmission number and phase of the non-corrected surface of the substrate.

In a fourth aspect, the present invention is directed to a method of forming a photomask for photolithography comprising the steps of: providing a light transmittable substrate; planarizing the light transmittable substrate; correcting any defects on the substrate by implanting a light absorbing material into the defects to form a stained defect, and irradiating the stained defect to effectively remove the defect; forming a light blocking layer on the substrate; and patterning the light blocking layer.

The step of providing a light transmittable substrate may comprise providing a light transmittable substrate comprising glass, soda lime glass, quartz or sapphire. The step of correcting any defects on the substrate may occur prior to the step of forming a light blocking layer on the substrate. Alternatively, the step of correcting any defects on the substrate may occur after the step of forming a light blocking layer on the substrate.

Preferably, the step of correcting any defects on the substrate comprises correcting bump defects on the substrate by implanting light absorbing ions selected from the group consisting of gallium, boron, phosphorus, arsenic, antimony, and combinations thereof, into the defects to such a depth that upon irradiating the stained defect, only portions of the substrate which are stained are effectively removed. Preferably, the step of correcting any defects on the substrate comprises correcting a divot defect on the substrate by implanting a light absorbing material surrounding the divot to form a stained defect, irradiating the stained defect, and planarizing a top surface of the substrate to remove additional substrate material equal to a depth of material removed when irradiating the stained defect to retain a prior phase shift of the photomask.

Preferably, the step of forming a light blocking layer comprises depositing a light blocking layer comprising chromium on the substrate. The step of forming a light blocking layer may also comprise blanket ion implantation of a light blocking material into a surface of the substrate.

Preferably, the step of patterning the light blocking layer comprises applying a photoresist over the light blocking layer, exposing a pattern on the photoresist and removing the photoresist.

In a fifth aspect, the present invention is directed to a method of forming a reticle for photolithography comprising the steps of: providing a light transmittable substrate; blanket implanting ions of a light blocking material into a surface of the substrate forming a stained substrate; exposing the stained substrate to laser ablation at pulses of not greater than about $10^{-15}$ seconds; and removing portions of the stained substrate in a pattern corresponding to an integrated circuit.

Preferably, the step of blanket implanting ions of a light blocking material comprises blanket implanting a light blocking material selected from the group consisting of gallium, boron, phosphorus, arsenic, antimony and combinations thereof. During the step of blanket implanting ions of a light blocking material, a depth of the ions of light blocking material implanted in the substrate determines a removal depth of portions of the stained substrate. The step of exposing the stained substrate to laser ablation at pulses of not greater than about $10^{-15}$ seconds may comprise exposing the stained substrate to femtosecond or attosecond laser ablation for a sufficient number of pulses to vaporize portions of the stained substrate corresponding to an integrated circuit pattern while a radiant energy of the femtosecond ablation does not dissipate into the substrate.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
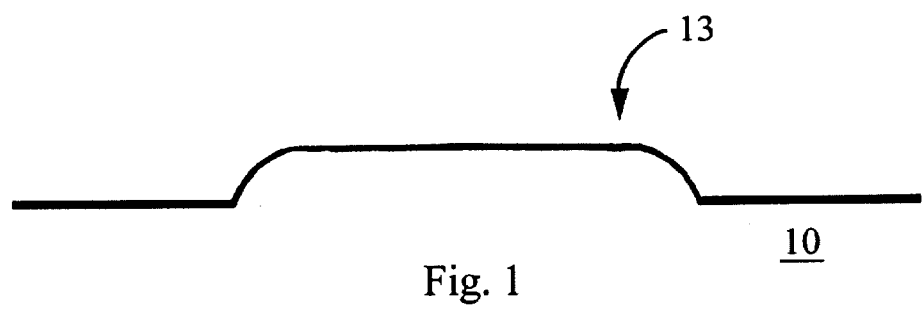
FIG. 1 is a cross-sectional view of a substrate having a bump defect.

In describing the preferred embodiment of the present invention, reference will be made herein to FIGS. 1–10 of the drawings in which like numerals refer to like features of the invention. Features of the invention are not necessarily shown to scale in the drawings.

The present invention provides a method of controlling the precise removal of unwanted material from a light transmittable substrate for isolating and removing defects from a surface of the light transmittable substrate and for direct writing of a reticle or photomask, and the resultant reticle or photomask. The depth of ion implantation of a light absorbing material such as gallium, arsenic, boron, phosphorus and antimony into the defect and/or the areas surrounding the defect on the light transmittable substrate controls the depth of material removed from the substrate. Unexpectedly, the use of femtosecond and sub-femtosecond laser ablation, e.g., pulses not greater than $10^{-15}$ seconds, to remove the unwanted material provides precision removal while preventing heat damage to the substrate. The short duration laser pulse of a femtosecond and/or attosecond laser makes it possible to vaporize the unwanted material by impinging a large amount of laser energy in a short period of time, not greater than $10^{-15}$ seconds, at the location of the stains created by implanting the light absorbing material since the light no longer passes through the substrate. There is energy to vaporize the unwanted material since the time to deliver the energy is substantially shorter than the time to dissipate the energy into the substrate. The present invention overcomes the constraints of the prior art use of longer duration lasers, nanosecond and picosecond lasers, which resulted in incomplete removal of the unwanted material and would actually push the implanted ions further into the substrate by a thermal wave. The present invention provides an effective and cost efficient way of repairing the light transmittable substrates allowing previously scrapped substrates to be repaired resulting in less waste and lower manufacturing costs.

Illustrated in FIG. 1 is a substrate 10 having a bump defect 13 resulting from incomplete planarization of the substrate. Substrate 10 may be comprised of any light transmittable material, particularly those materials useful for forming reticles used in photolithography for semiconductor manufacture wherein light is able to pass directly through the substrate with minimal reflectance and damage. Examples of such light transmittable materials include quartz, quartz doped with about 5 to about 100 parts per million fluorine, soda lime glass, and sapphire. The substrate must be planarized prior to fabricating the reticle using methods known in the art such as chemical mechanical polishing or chemical etching. However, sometimes the planarization is not completely effective in planarizing the substrate within acceptable process parameters, and as a result, defects are formed such as bump 13 and divots (which are described later).

Figure 2:
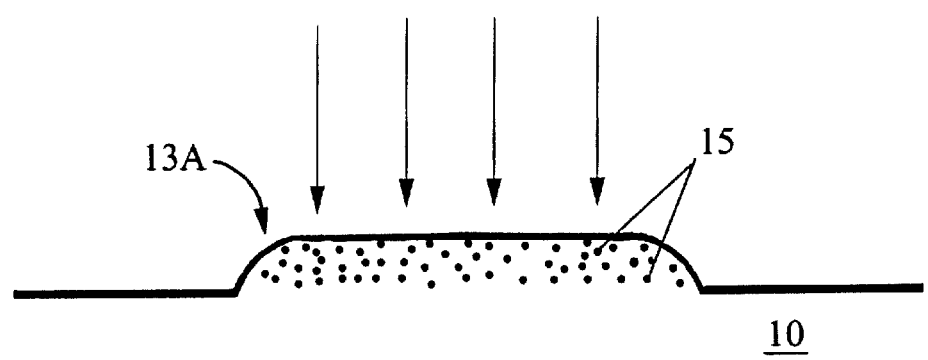
FIG. 2 is a cross-sectional view of the substrate of FIG. 1 undergoing ion implantation to stain the bump defect prior to removal in accordance with a method of the present invention.

In order to begin the process of isolating and removing bump 13, ions 15 of a light blocking material are implanted into bump 13 as shown in FIG. 2. Preferably, the ions are implanted using a Focused Ion Beam (FIB) tool such as a Model 9000 FIB utilizing a gallium source available from the Micron Corporation of Peabody, Mass., although other known means of ion implantation may be used. Ions 15 may comprise any material(s) which can block light at the wavelengths used during photolithography, usually at 248 nm, 193 nm, and at 157 nm. Preferably, ions 15 may comprise gallium, boron, phosphorus, arsenic, antimony, and combinations thereof. An FIB which can produce an ion beam having more than one source of the preferred light blocking materials would provide additional control in isolating the bump defects since the different ions implant at different depths. The depth is also controlled by the implant energy. For example, substrate areas closer to the surface may be implanted with gallium while boron ions may be implanted into deeper regions of the substrate. Therefore, controlling the depth of implantation with different ions or energies also controls the depth of removing the unwanted material.

Figure 3:
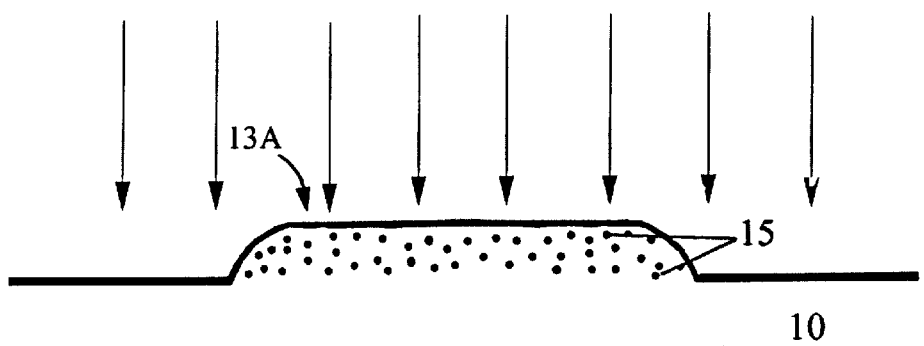
FIG. 3 is a cross-sectional view of the substrate wherein the stained bump defect is undergoing irradiation with a femtosecond laser in accordance with a method of the present invention.
Figure 4:
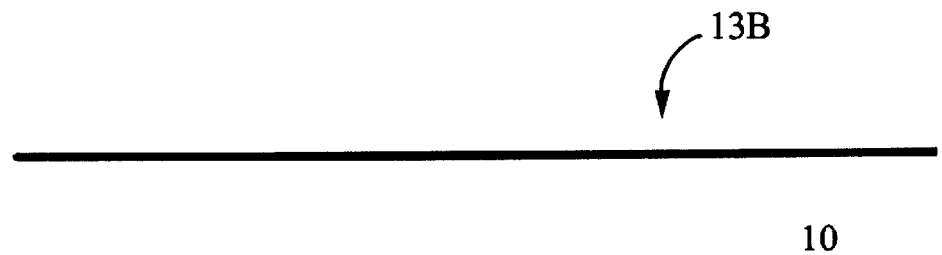
FIG. 4 is a cross-sectional view of the repaired substrate after the removal of the bump defect in accordance with a method of the present invention.

Referring back to FIG. 2, ion implantation is directed only to the localized area of bump 13 now stained with the light blocking material as represented by reference number 13A. A gradient of ions 15 may also be formed such that ions 15 are concentrated at the highest point of bump 13A so that during laser ablation, the laser is directed to the area of greatest ion implantation and thoroughly vaporizes the bump defect planarizing the substrate. With reference to FIG. 3, the arrows represent the irradiation by laser ablation of stained bump 13A. Any laser capable of not greater than $10^{-15}$ second pulses may be used to vaporize bump 13A. Preferably, a Model MXR CPA-2000 from Clark Corporation of Detroit, Mich., is used to vaporize stained bump 13A operating at a wavelength of 387.5 nm. Using a 100 femtosecond pulse, approximately 30 pulses in 30 seconds at about 1 to about 20 $\mu$Joules per pulse, preferably about 5 $\mu$Joules per pulse, will effectively vaporize stained bump 13A. The resulting planar substrate 10 is shown in FIG. 4 wherein the planarity of substrate 10 is a direct result of the depth of ion implantation as a method of controlled repair and removal of the bump defect.

Figure 5:
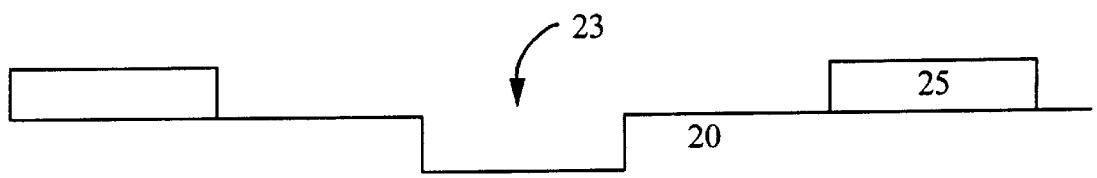
FIG. 5 is a cross-sectional view of a substrate having a divot defect.

Repair of a divot defect is illustrated in FIGS. 5–8. A substrate 20 comprising a light transmittable material is shown in FIG. 5 having formed thereon a patterned and etched light blocking material 25. In manufacturing a reticle for photolithography, integrated circuit patterns are formed on the reticle substrate by depositing a layer of a light blocking material such as chromium, chrome oxide, gold and other materials known in the art. Divot 23 may have been a result of planarization prior to deposition of the light blocking material 25 or formed during patterning and etching of light blocking material 25. In either instance, the repair and removal method of the present invention may be practiced with or without the light blocking layer present.

Figure 6:
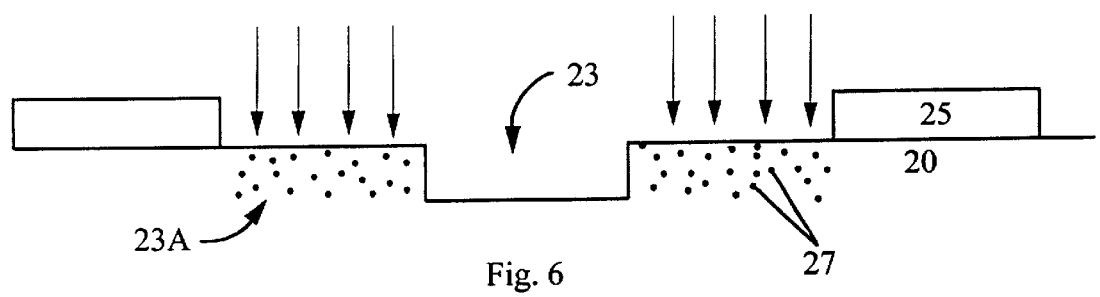
FIG. 6 is a cross-sectional view of the substrate of FIG. 5 undergoing ion implantation to stain the area adjacent the divot defect prior to removal in accordance with a method of the present invention.
Figure 7:
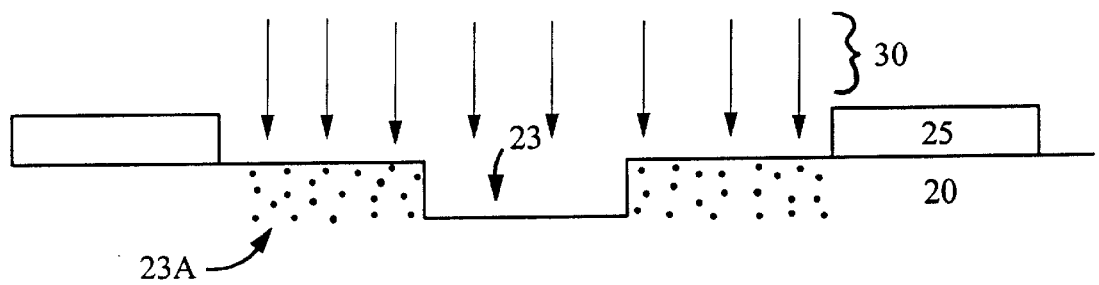
FIG. 7 is a cross-sectional view of the substrate wherein the stained area adjacent the divot defect is undergoing irradiation with a femtosecond laser in accordance with a method of the present invention.
Figure 8:
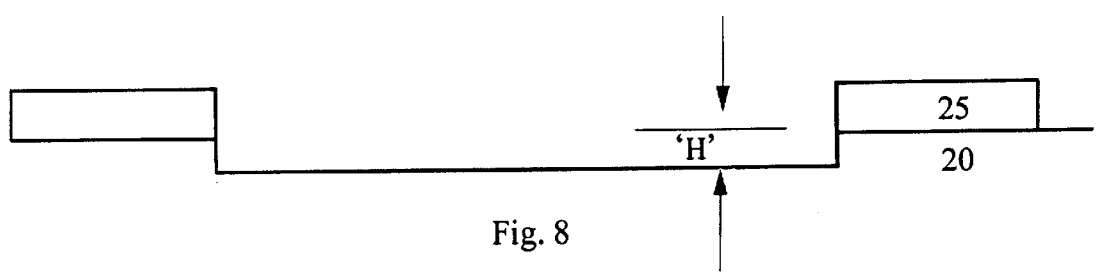
FIG. 8 is a cross-sectional view of the repaired substrate after planarization down to the lowest point of the divot defect.

As in the bump defect repair and removal method described above, the process begins with ion implantation represented by the arrows in FIG. 6. Ions 27 are implanted into the area adjacent divot 23 and between areas of light blocking material 25 to form stained area 23A. Ions 27 are preferably gallium, boron, phosphorus, arsenic, antimony, and combinations thereof implanted into substrate 20 with an FIB using one or more of the ion sources. Again, the depth of the ion implantation will determine the depth of removing the unwanted substrate material such that a substantially planar surface will be formed between the light blocking material 25. In FIG. 7, the stained area 23A may be removed with irradiation utilizing a femtosecond or subfemtosecond laser described above and represented by arrows 30. Using an about 100 femtosecond pulse, at about 1 to about 20 $\mu$Joules per pulse, preferably about 5 $\mu$Joules per pulse, the laser will effectively vaporize stained area 23A. The depth of removal should be planar with the deepest point of divot 23 as shown in FIG. 8 wherein 'H' is equal to the height from the innermost depth of divot 23 to the top surface of substrate 20. However, if 'H' results in greater than a 60° phase shift, than the surface of the reticle in this area not covered by the patterned light blocking material 25 must be removed or "stepped down" by a distance that will cause a 360° phase shift. The second removal step may also be performed by laser ablation to remove sufficient depths of the substrate such that a transmission number for the corrected surface is about equal to a transmission number and phase for the subsequently planarized surfaces. The transmission number is the working wavelength wherein greater than 98% transmittance of light is achieved.

Figure 9:
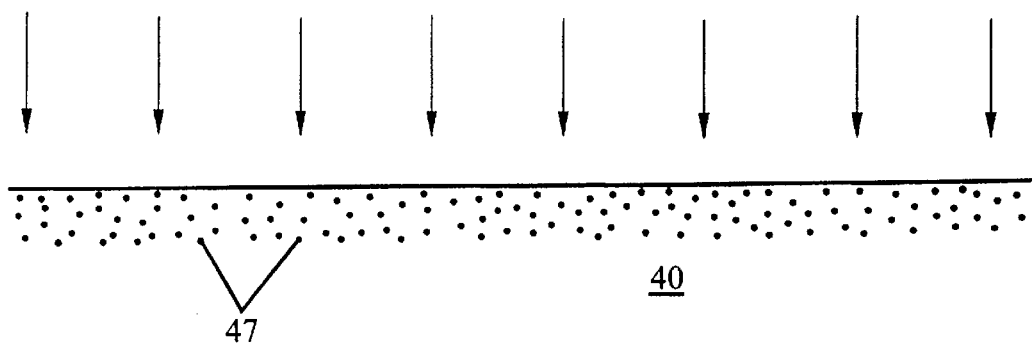
FIG. 9 is a cross-sectional view of a substrate during the ion implantation step of the present invention to stain a surface of the substrate.
Figure 10:
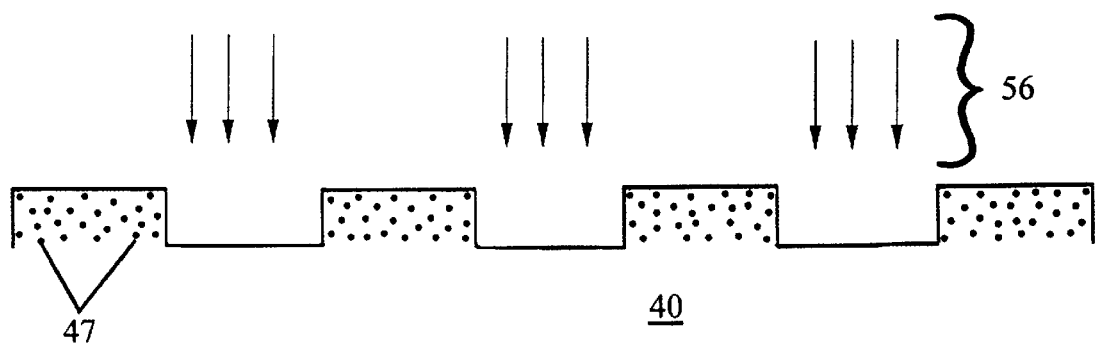
FIG. 10 is a cross-sectional view of the substrate wherein the stained area is selectively irradiated with a femtosecond laser to produce a reticle of the present invention.

The ion implantation and laser ablation method described above is also useful in direct writing of a photolithography reticle. In FIG. 9 there is illustrated a substrate 40 comprising a light transmittable material such as quartz. Ions 47 comprising a light blocking material such as gallium, boron, phosphorus, arsenic, antimony and combinations thereof are blanket implanted over the entire surface of substrate 40 as shown by the arrows. Advantageously, since the depth of ion implantation determines the depth of etching and removal of the unwanted portions of the substrate surface, precise patterns may be etched using femtosecond laser ablation. Thus, in FIG. 10, arrows 56 representing the irradiation from the laser ablation may precisely remove unwanted portions of substrate 40 leaving a pattern of light blocking material corresponding to the integrated circuit. The laser ablation vaporizes the desired portions of the stained substrate while the radiant energy of the laser does not dissipate into the substrate thereby eliminating any heat damage to the reticle.

The present invention achieves the objects recited above. It has been found that the depth of ion implantation into the transparent substrate such as quartz or any other light transmittable material is a self-limiting step for subsequent femtosecond and/or attosecond laser ablation to provide a precise and localized method of repairing and removing defects on a reticle or photomask substrate. By staining only affected areas on the light transmittable substrate with the light blocking material, irradiation of the stain with laser ablation at not greater than $10^{-5}$ second pulses results in carefully controlled removal of a bump or divot defect resulting in a substantially planar corrected substrate surface. Such precision allows direct writing of a reticle or photomask so that the projected image is within the tight line resolution constraints required in photolithography techniques.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of correcting a bump defect on a phase shift mask comprising the steps of:

implanting a light absorbing material into said bump defect; and pulse laser irradiating said light absorbing material implanted into said bump defect until substantially all of said light absorbing material and defect is removed.

2. The method of claim 1 wherein the step of implanting a light absorbing material comprises implanting a light absorbing material selected from the group consisting of gallium, boron, phosphorus, arsenic, antimony and combinations thereof.

3. The method of claim 1 wherein the step of implanting a light absorbing material comprises implanting gallium ions into said bump defect.

4. The method of claim 1 wherein the step of irradiating said light absorbing material comprises irradiating said light absorbing material with a laser operating at femtosecond pulses.

5. The method of claim 1 wherein the step of irradiating said light absorbing material comprises irradiating said light absorbing material with a laser operating at attosecond pulses.

6. A method of correcting a defect in a substrate comprising the steps of:

providing a light transmittable substrate, said substrate having one or more bump defects;

implanting light absorbing ions into a bump defect on said substrate to form a stained bump;

pulse laser ablating the stained bump leaving a corrected surface of said substrate which is substantially planar.

7. The method of claim 6 wherein the step of providing a light transmittable substrate comprises providing a substrate comprising glass, soda lime glass, quartz or sapphire.

8. The method of claim 6 wherein the step of providing a light transmittable substrate comprises providing a substrate comprising silicon dioxide doped with about 100 parts per million fluorine.

9. The method of claim 6 wherein the step of providing a light transmittable substrate comprises providing a light transmittable substrate having a layer of a patterned light blocking material thereover.

10. The method of claim 6 wherein the step of providing a light transmittable substrate comprises providing a reticle for photolithography.

11. The method of claim 6 wherein the step of implanting light absorbing ions comprises implanting light absorbing ions selected from the group consisting of gallium, boron, phosphorus, arsenic, antimony and combinations thereof.

12. The method of claim 6 wherein the step of implanting light absorbing ions comprises implanting light absorbing ions such that a concentration gradient of said light absorbing ions extends into said substrate from a top surface of the bump defect.

13. The method of claim 6 wherein the step of implanting light absorbing ions comprises:

implanting light absorbing ions into the bump defect such that said light absorbing ions are implanted into the bump defect at a distance equal to a maximum height of the bump defect; and implanting light absorbing ions into the bump defect such that said light absorbing ions are implanted into the bump defect at a distance less than a maximum height of the bump defect such that during the step of laser ablating the stained bump, only those areas stained by implantation are removed to control formation of a substantially planar corrected surface.

14. The method of claim 6 wherein the step of implanting light absorbing ions utilizes a focused ion beam having a source selected from the group consisting of gallium, boron, phosphorus, arsenic, antimony and combinations thereof.

15. The method of claim 6 wherein the step of implanting light absorbing ions controls the depth of substrate material removed during the step of laser ablating the stained bump.

16. The method of claim 6 wherein the step of laser ablating comprises irradiating the stained bump with a laser at such an energy and for a period of time that heat does not dissipate into said substrate utilizing pulses not greater than $10^{-15}$ seconds.

17. A method of repairing a defect on a substrate comprising the steps of:

providing a transmittable substrate having thereover a patterned light blocking layer, said substrate having one or more divots thereon;

implanting a light absorbing material into said substrate surrounding the one or more divots forming a stained area around said divot; and pulse laser ablating the stained area leaving a corrected surface planar with a surface of the divot utilizing pulses not greater than $10^{-15}$ seconds.

18. The method of claim 17 wherein during the step of laser ablating the stained area, if a depth of substrate material removed is greater than 60° of phase, the method further includes the step of implanting a light absorbing material into non-corrected areas of said substrate to cause a phase of said substrate to be 360°, and laser ablating the non-corrected surface of said substrate such that a transmission phase for the corrected surface is about equal to a transmission number and phase of the non-corrected surface of said substrate.

19. A method of forming a photomask for photolithography comprising the steps of:

providing a light transmittable substrate;

planarizing said light transmittable substrate;

correcting any defects on said substrate by implanting a light absorbing material into the defects to form a stained defect, and pulse laser irradiating the stained defect to effectively remove the defect;

forming a light blocking layer on said substrate; and patterning said light blocking layer.

20. The method of claim 19 wherein the step of providing a light transmittable substrate comprises providing a light transmittable substrate comprising glass, soda lime glass, quartz or sapphire.

21. The method of claim 19 wherein the step of correcting any defects on said substrate occurs prior to the step of forming a light blocking layer on said substrate.

22. The method of claim 19 wherein the step of correcting any defects on said substrate occurs after the step of forming a light blocking layer on said substrate.

23. The method of claim 19 wherein the step of correcting any defects on said substrate comprises correcting bump defects on said substrate by implanting light absorbing ions selected from the group consisting of gallium, boron, phosphorus, arsenic, antimony, and combinations thereof, into the defects to such a depth that upon irradiating the stained defect, only portions of said substrate which are stained are effectively removed.

24. The method of claim 19 wherein the step of correcting any defects on said substrate comprises correcting a divot defect on said substrate by implanting a light absorbing material surrounding the divot to form a stained defect, irradiating the stained defect, and planarizing a top surface of said substrate to remove additional substrate material equal to a depth of material removed when irradiating the stained defect to retain a prior phase shift of said photomask.

25. The method of claim 19 wherein the step of forming a light blocking layer comprises depositing a light blocking layer comprising chromium on said substrate.

26. The method of claim 19 wherein the step of forming a light blocking layer comprises blanket ion implantation of a light blocking material into a surface of said substrate.

27. The method of claim 19 wherein the step of patterning said light blocking layer comprises applying a photoresist over said light blocking layer, exposing a pattern on said photoresist and removing said photoresist.

28. A method of forming a reticle for photolithography comprising the steps of:

providing a light transmittable substrate;

blanket implanting ions of a light blocking material into a surface of said substrate forming a stained substrate;

exposing the stained substrate to pulse laser ablation at pulses of not greater than about $10^{-15}$ seconds; and removing portions of the stained substrate in a pattern corresponding to an integrated circuit.

29. The method of claim 28 wherein the step of blanket implanting ions of a light blocking material comprises blanket implanting a light blocking material selected from the group consisting of gallium, boron, phosphorus, arsenic, antimony and combinations thereof.

30. The method of claim 28 wherein during the step of blanket implanting ions of a light blocking material, a depth of said ions of light blocking material implanted in said substrate determines a removal depth of portions of the stained substrate.

31. The method of claim 28 wherein the step of exposing the stained substrate to laser ablation at pulses of not greater than about $10^{-15}$ seconds comprises exposing the stained substrate to laser ablation at pulses of about $10^{-15}$ seconds for a sufficient number of pulses to vaporize portions of the stained substrate corresponding to an integrated circuit pattern while a radiant energy of the laser ablation does not dissipate into said substrate.

32. The method of claim 28 wherein the step of exposing the stained substrate to laser ablation at pulses of not greater than about $10^{-15}$ seconds comprises exposing the stained substrate to laser ablation at pulses of about $10^{-18}$ seconds for a sufficient number of pulses to vaporize portions of the stained substrate corresponding to an integrated circuit pattern while a radiant energy of the laser ablation does not dissipate into said substrate.

\* \* \* \* \*